US011194946B2

(12) United States Patent
Javadiabhari et al.

(10) Patent No.: US 11,194,946 B2
(45) Date of Patent: Dec. 7, 2021

(54) OPTIMIZATION OF QUANTUM CIRCUITS

(71) Applicant: International Business Machines Corporation, Armonk, NY (US)

(72) Inventors: Ali Javadiabhari, Sleepy Hollow, NY (US); Jay M. Gambetta, Yorktown Heights, NY (US); Andrew W. Cross, Yorktown Heights, NY (US); Luciano Bello, New York, NY (US); Marco Pistoia, Amawalk, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 342 days.

(21) Appl. No.: 16/115,828

(22) Filed: Aug. 29, 2018

(65) Prior Publication Data
US 2020/0074035 A1 Mar. 5, 2020

(51) Int. Cl.
*G06F 30/337* (2020.01)
*G06F 30/39* (2020.01)
*G06N 10/00* (2019.01)
*G06F 17/16* (2006.01)

(52) U.S. Cl.
CPC ............. *G06F 30/39* (2020.01); *G06N 10/00* (2019.01); *G06F 17/16* (2013.01)

(58) Field of Classification Search
CPC ........ G06N 10/00; G06N 20/00; G06N 20/10; G06N 5/003; B82Y 10/00; B82Y 20/00; G06F 17/16; G06F 17/18; G06F 16/9024; G06F 17/5009; G06F 17/10; G06F 17/5022; G06F 2207/4802; G06F 2212/1044;
(Continued)

(56) References Cited

U.S. PATENT DOCUMENTS 9,836,698 B2 12/2017 Bocharov et al.
2006/0123363 A1* 6/2006 Williams ............... G06N 10/00
716/101
2017/0147303 A1 5/2017 Amy et al.
(Continued)

FOREIGN PATENT DOCUMENTS

WO 2010148120 A2 12/2010

OTHER PUBLICATIONS

Verified compilation of space-efficient reversible circuits, Matthew Amy,https://arxiv.org/pdf/1603.01635.pdf.
(Continued)

*Primary Examiner* — Nghia M Doan
(74) *Attorney, Agent, or Firm* — Garg Law Firm, PLLC; Rakesh Garg; Joseph Petrokaitis

(57) ABSTRACT

A method for design optimization of a quantum circuit includes analyzing a first quantum circuit design based on at least one of a set of design criteria, wherein the first quantum circuit design includes a set of quantum logic gates, and wherein a design criterion in the set of design criteria includes changing a size of a matrix of transformations corresponding to a number of qubits employed in the first quantum circuit design. The embodiment further includes in the method modifying the first quantum circuit design into a transformed quantum circuit design, the modifying causing the transformed quantum circuit design to perform an operation implemented in the first quantum circuit design with a changed matrix of transformations.

19 Claims, 11 Drawing Sheets

(58) Field of Classification Search
CPC ........ G06F 30/39; G06F 30/30; G06F 30/337;
H04B 10/70
USPC ........ 716/103–104, 132; 703/2–3, 5, 13–14;
438/962; 257/9, E29.069–E29.074
See application file for complete search history.

(56) References Cited

U.S. PATENT DOCUMENTS

| | | |
|---|---|---|
| 2017/0161612 A1 | 6/2017 | Hastings et al. |
| 2017/0228483 A1 | 8/2017 | Rigetti et al. |
| 2018/0039903 A1* | 2/2018 | Mosca ................... G06N 10/00 |
| 2018/0181685 A1 | 6/2018 | Martin et al. |
| 2019/0220782 A1* | 7/2019 | Chen ...................... G06N 5/003 |

OTHER PUBLICATIONS

PCT, International Searching Authority, P201805390, PCT/EP2019/070871, dated Oct. 24, 2019.

Maslov et al., "Quantum Circuit Simplification and Level Compaction", IEEE Transactions On Computer-Aided Design of Integrated Circuits and Systems, vol. 27, No. 3, Mar. 2008.

* cited by examiner

*FIGURE 3B*
(PRIOR ART)

$|\psi\rangle = \alpha|0\rangle + \beta|1\rangle$ $|0\rangle = \begin{bmatrix}1\\0\end{bmatrix} \quad |1\rangle = \begin{bmatrix}0\\1\end{bmatrix}$ $|\psi\rangle \longrightarrow \underbrace{\oplus}_{302} \longrightarrow X|\psi\rangle$ $X = \begin{bmatrix}0 & 1\\1 & 0\end{bmatrix}$ $X|\psi\rangle = \beta|0\rangle + \alpha|1\rangle$

OPTIMIZATION OF QUANTUM CIRCUITS

TECHNICAL FIELD

The present invention relates generally to quantum computing. More particularly, the present invention relates to a method for design optimization of quantum circuits.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These is and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature-pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. Information is carried or transmitted in a single photon. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

In conventional circuits, Boolean logic gates arranged in succession manipulate a series of bits. The technology for optimizing the gate-logic for binary computations is well-known. Circuit optimization software for conventional circuits aims to increase efficiency and decrease complexity of conventional circuits. Circuit optimization software for conventional circuits functions in part by decomposing the overall desired behavior of the conventional circuit into simpler functions. The conventional circuit optimization software more easily manipulates and processes the simpler functions. The circuit optimization software generates an efficient layout of design elements on the conventional circuit. As a result, circuit optimization software for conventional circuits significantly reduces resource demands, thereby increasing efficiency and decreasing complexity.

The illustrative embodiments recognize that in quantum circuits, quantum gates manipulate qubits to perform quantum computations. Quantum gates are unitary matrix transformations acting on qubits. Due to the superposition and entanglement of qubits, quantum gates represent a $2^n$ by $2^n$ matrix, where n is the number of qubits the quantum gate manipulates. The illustrative embodiments recognize that the decomposition of such matrix transformations quickly becomes too complex to perform by hand due to the exponential increase in the size of the matrix transformations with the number of qubits. For example, quantum computers with 2 qubits require a 4 by 4 matrix operator for quantum gate representation. A quantum computer with 10 qubits require a 1024 by 1024 matrix operator for quantum gate representation. As a result of the exponential increase, manual quantum logic gate matrix transformations quickly become unmanageable as the number of qubits increases.

Circuit optimization for quantum circuits depends on the chosen function, resource requirements, and other design criteria for the quantum circuit. For instance, quantum circuits are often optimized to work with a specific device.

Therefore, there is a need for improved methods for design optimization of quantum circuits.

Quantum circuit optimization according to the illustrative embodiments described herein takes the form of passes which traverse the quantum circuit. Each pass may perform a specific task. For example, an analysis pass of an embodiment collects information about the quantum circuit. A transformation pass of an embodiment alters the quantum circuit design. Several passes and relationships therebetween are described herein with respect to several embodiments.

SUMMARY

The illustrative embodiments provide a method for design optimization of quantum circuits. An embodiment includes a method that analyzes a first quantum circuit design based on at least one of a set of design criteria, wherein the first quantum circuit design includes a set of quantum logic gates, and wherein a design criterion in the set of design criteria includes changing a size of a matrix of transformations corresponding to a number of qubits employed in the first quantum circuit design. The embodiment modifies the first quantum circuit design into a transformed quantum circuit design, the modifying causing the transformed quantum circuit design to perform an operation implemented in the first quantum circuit design with a changed matrix of transformations.

An embodiment decomposes a first quantum logic gate of the transformed quantum circuit design into at least two quantum logic gates. Another embodiment reduces a total number of quantum logic gates of the first quantum circuit design. Another embodiment replaces at least one quantum logic gate.

In another embodiment, analyzing the first quantum circuit design determines a depth of the first quantum circuit design. The embodiment analyzes the transformed quantum circuit design to determine a depth of the transformed quantum circuit design.

In another embodiment, analyzing the first quantum circuit design determines a first entanglement state of a first qubit. The embodiment analyzes the transformed quantum circuit design to determine a second entanglement state of the first qubit.

Another embodiment decomposes each instance of a single type of quantum logic gate.

In another embodiment, a total number of logic gates of the transformed quantum circuit design is less than a total number of logic gates of the first quantum circuit design.

An embodiment includes a computer usable program product. The computer usable program product includes a computer-readable storage device, and program instructions stored on the storage device.

An embodiment includes a computer system. The computer system includes a processor, a computer-readable memory, and a computer-readable storage device, and program instructions stored on the storage device for execution by the processor via the memory.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 3B depicts a schematic diagram of an example quantum logic gate for a quantum circuit and associated logic table;

DETAILED DESCRIPTION

Figure 1:
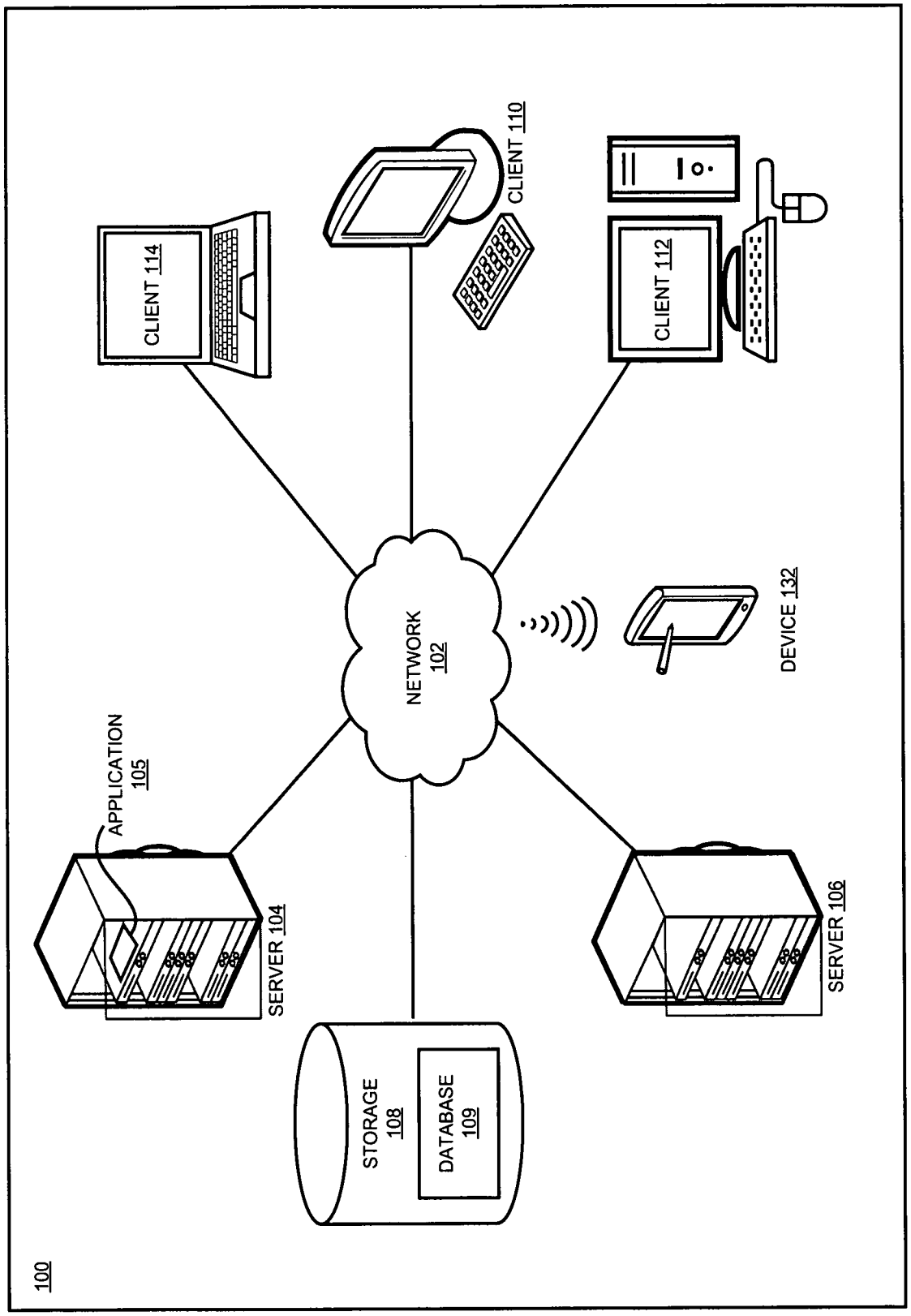
FIG. 1 depicts a block diagram of a network of data processing systems in which illustrative embodiments may be implemented.

The illustrative embodiments used to describe the invention generally address and solve the above-described problem of design optimization for quantum circuits. The illustrative embodiments provide a method for design optimization of quantum circuits.

An embodiment provides a method for design optimization of quantum circuits. Another embodiment provides a computer usable program product comprising a computer-readable storage device, and program instructions stored on the storage device, the stored program instructions comprising a method for design optimization of quantum circuits. The instructions are executable using a conventional binary processor. Another embodiment provides a computer system comprising a conventional binary processor, a computer-readable memory, and a computer-readable storage device, and program instructions stored on the storage device for execution by the conventional binary processor via the memory, the stored program instructions comprising a method for design optimization of quantum circuits.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the data processing environments are used in the figures and the illustrative embodiments. In an actual computing environment, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for design optimization of quantum circuits using a variety of components that can be purposed or repurposed to provide a described function within a data processing environment, and such adaptations are contemplated within the scope of the illustrative embodiments.

The illustrative embodiments are described with respect to certain types of steps, applications, quantum logic gates, and data processing environments only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
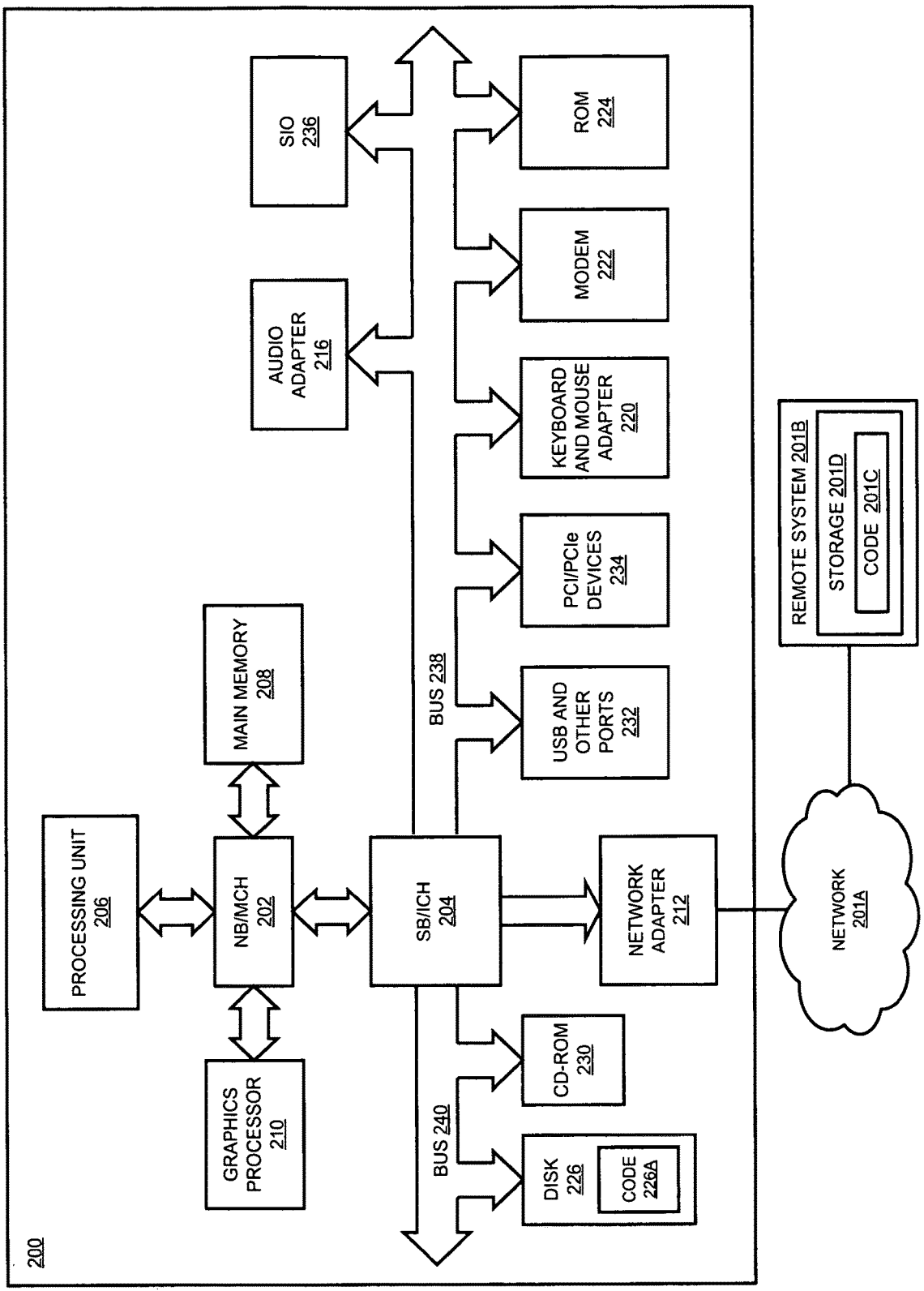
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Servers 104 and 106, storage unit 108, and clients 110, 112, and 114, and device 132 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown. Server 104 includes application 105 that may be configured to implement one or more of the functions described herein for design optimization of a quantum circuit in accordance with one or more embodiments. Storage device 108 includes one or more databases 109 configured to store quantum circuit design information, such as quantum logic gate representations.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications. Data processing environment 100 may also take the form of a cloud, and employ a cloud computing model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system for any type of computing platform, including but not limited to server systems, personal computers, and mobile devices. An object oriented or other type of programming system may operate in conjunction with the operating system and provide calls to the operating system from programs or applications executing on data processing system 200.

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3A:
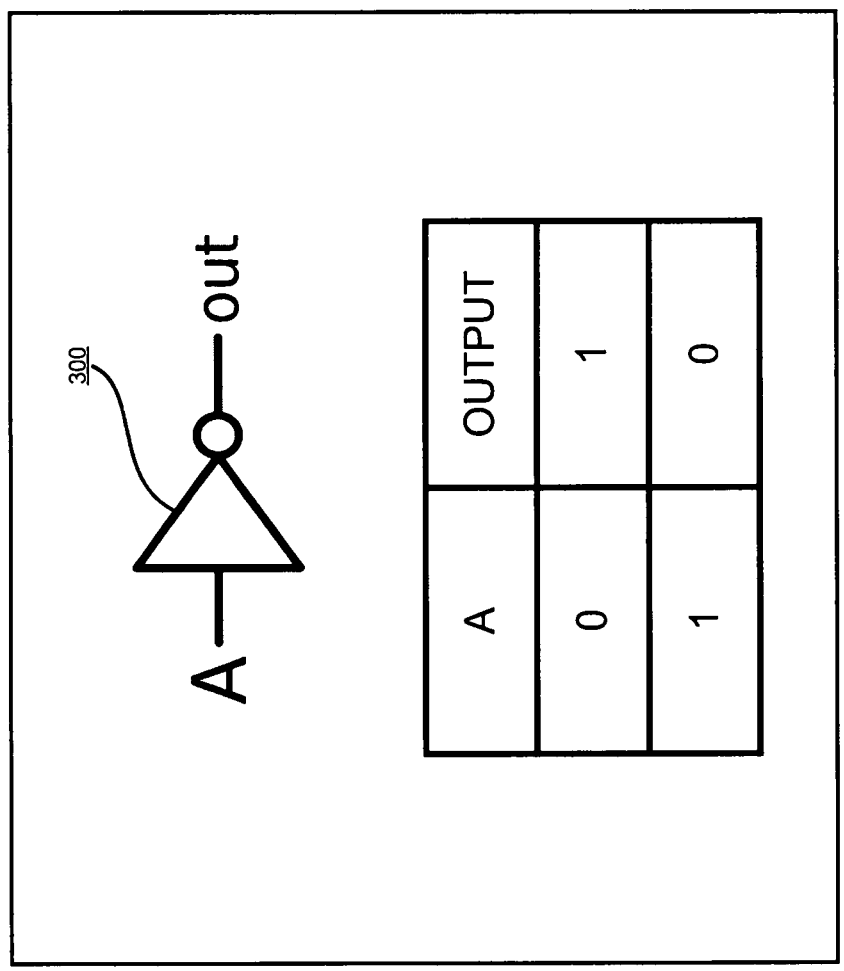
FIG. 3A depicts a schematic diagram of an example Boolean logic gate for a conventional circuit and associated logic table.

With reference to FIG. 3A, this figure depicts a schematic diagram of an example Boolean logic gate for a conventional circuit and associated logic table. Logic gate 300 represents a NOT gate for a conventional circuit. Logic gate 300 manipulates bit A according to the logic table shown. Logic gate 300 inverts the state of bit A. For example, logic gate 300 inverts a "true" or "1" state to a "false" or "0" state.

A conventional circuit comprises numerous logic gates, including NOT gate 300, NOR gate, AND gate, XOR gate, and many other types of gates and gate combinations. It is not uncommon for a conventional circuit to include thousands of gates in this manner. A conventional circuit optimization problem seeks to optimize the number of gates, the arrangement of gates, the alteration of gate combinations, or some combination thereof. The illustrative embodiments recognize that optimizing a quantum circuit operates in a different manner than conventional circuit optimization, is not a suitable parallel of conventional circuit optimization, and cannot be derived or adapted from optimization techniques for conventional circuit optimization, owing to the reasons pertaining to quantum computing as described herein.

With reference to FIG. 3B, this figure depicts a schematic diagram of an example quantum logic gate for a quantum circuit and associated logic table. Quantum logic gate 302 represents a quantum equivalent of the NOT gate for conventional circuits. Qubit $\psi$ represents a superposition of states with respective probability amplitudes, $\alpha$ and $\beta$. Quantum logic gate 302 manipulates qubit $\psi$ by multiplying the bit by matrix X. As shown in FIG. 3B, output of logic gate 302 is a qubit with probability amplitudes, $\alpha$ and $\beta$, switched from the corresponding states of qubit $\psi$. For example, a first state of qubit $\psi$ has a probability amplitude $\alpha$ and a second state of qubit $\psi$ has a probability amplitude $\beta$ before manipulation by quantum logic gate 302. After manipulation by quantum logic gate 302, the first state of the manipulated qubit has a probability amplitude $\beta$ and the second state of the manipulated qubit has a probability amplitude $\alpha$.

Figure 4:
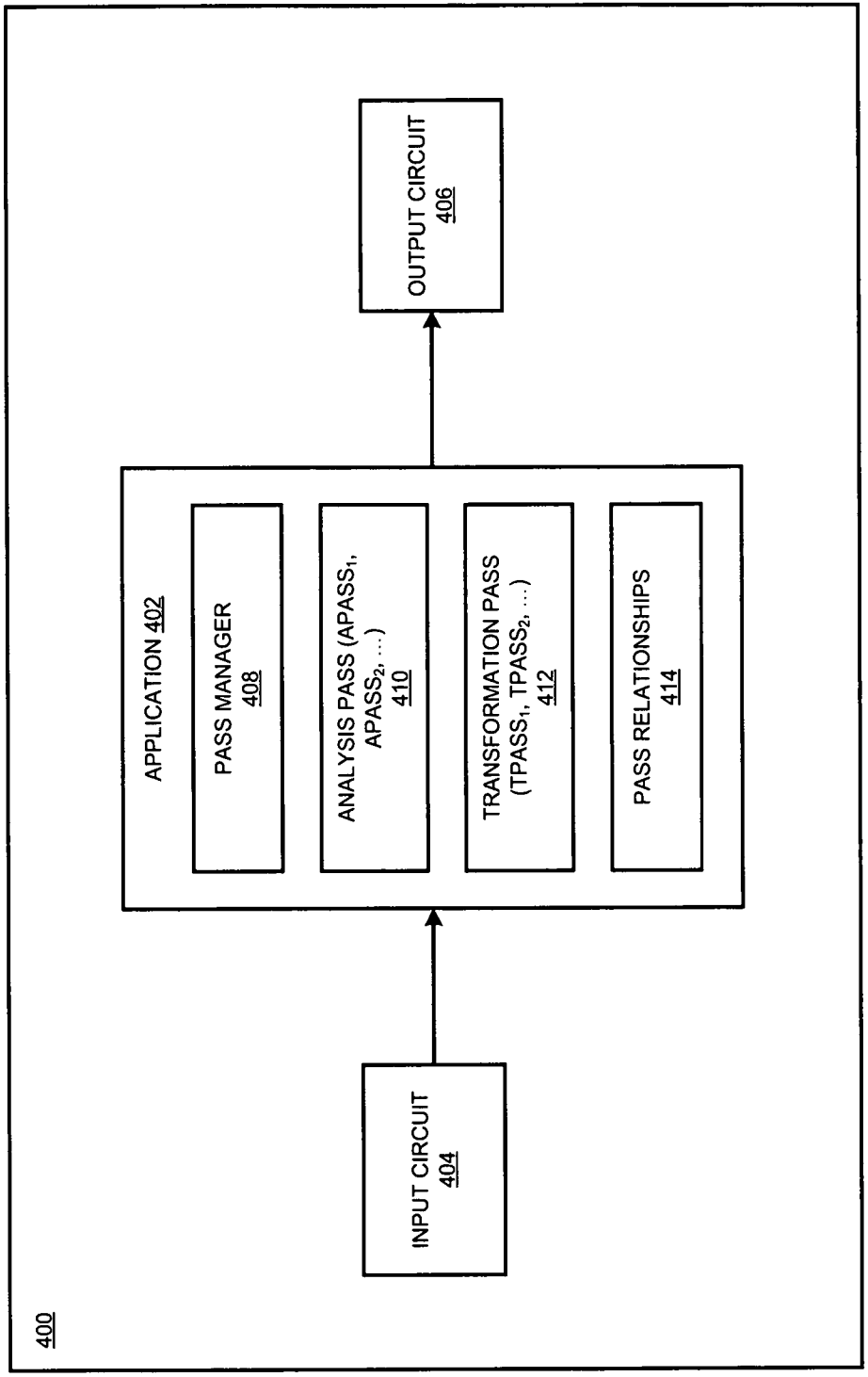
FIG. 4 depicts a block diagram of an example configuration for design optimization of a quantum circuit.

With reference to FIG. 4, this figure depicts a block diagram of an example configuration 400 for design optimization of a quantum circuit. The example embodiment includes an application 402. In a particular embodiment, application 402 is an example of application 105 of FIG. 1.

Application 402 receives an input quantum circuit design 404 from a user in which the quantum circuit design includes a number of quantum logic gates.

Application 402 includes a pass manager component 408, an analysis pass component 410, a transformation pass component 412, and a pass relationships component 414. In the embodiment, pass manager component 408 controls and manages a process for design optimization of the input quantum circuit design 404. For example, the pass manager component 408 launches various passes on the input quantum circuit, such as analysis passes and transformation passes. The pass manager component 408 receives an updated quantum circuit design. The pass manager component 408 collects and updates information about the input quantum circuit and updated quantum circuit. For example, the pass manager component collects and updates the number of qubits, the depth of the quantum circuit, the types of quantum logic gates, and the number of quantum logic gates.

Analysis pass component 410 analyzes the input quantum circuit and collects information, such as a number of quantum logic gates, the types of quantum logic gates, the depth of the quantum circuit, and the number of qubits. Analysis pass component 410 includes a set of analysis passes capable of being executed by pass manager component 408. For example, analysis pass component 410 analyzes a first quantum circuit design based on at least one of a set of design criteria for a new quantum circuit design. The quantum circuit design of an embodiment includes a set of quantum logic gates. A design criterion of the set of design criteria of an embodiment includes changing a size of a matrix of transformations corresponding to a number of qubits employed in the quantum circuit design. Once the analysis pass component 410 finishes an analysis pass on the quantum circuit, the collected information is returned to the pass manager component 408. The pass manager component 408 updates information about the input quantum circuit design and stores the information as an updated quantum circuit design.

Transformation pass component 412 modifies the input quantum circuit design into an updated quantum circuit design. Transformation pass component 412 includes a set of transformation passes capable of being executed by pass manager component 408. The transformation pass component 412 in an embodiment decomposes quantum logic gates, reduces the number of quantum logic gates, increases the number of quantum logic gates, replaces at least one quantum logic gate, and/or modifies the quantum circuit design in any other material way. For example, the transformation pass component 412 causes the transformed quantum circuit design to perform an operation implemented in the first quantum circuit design with a changed matrix of transformations. In one embodiment, the transformation pass component 412 decomposes a type of quantum logic gate. For example, the transformation pass component 412 decomposes a single quantum logic gate into at least two quantum logic gates.

In some embodiments, a single transformation pass decomposes each instance of a single type of quantum logic gate in the quantum circuit design. In another embodiment, the transformation pass component 412 reduces the total number of quantum logic gates of the quantum circuit design. For example, the transformation pass component 412 deletes redundant quantum logic gates. In another embodiment, the transformation pass component 412 replaces at least one quantum logic gate in the quantum circuit design. For example, the transformation pass component 412 replaces at least one quantum logic gate with one or more quantum logic gates.

In some embodiments, the pass manager 408 launches an analysis pass after each instance of a completed transformation pass. In some embodiments, the transformation pass component 412 also analyzes the transformed quantum circuit design after modifying the quantum circuit. The transformation pass component 412 returns the collected information to the pass manager component 408. The pass manager component 408 updates information about the transformed quantum circuit design and stores the information as an updated quantum circuit design. In some embodiments, the pass manager 408 launches a series of transformation passes and analysis passes. The pass manager 408 iterates between transformation passes and analysis passes until the transformed quantum circuit design meets at least one of a set of design criteria for a new quantum circuit design. For example, the threshold is reached when the previous quantum circuit design exhibits no further modification.

Pass relationship component 414 contains information about relationships between different passes. Pass relationship component 414 may be an optional component of the application 402. For example, a completed analysis pass may be required before beginning a particular transformation pass. Another pass relationship may preserve the modification of a previous transformation pass. For example, the modification performed by a first transformation pass may be guaranteed to be unaltered by a second transformation pass. For instance, a transformation pass decomposes each instance of a single type of quantum logic gates. A subsequent transformation pass may guarantee by a pass relationship that no new instance of the single type of quantum logic gates is introduced to the transformed quantum circuit design. The pass manager component 408 launches analysis passes and transformation passes according to the pass relationships in the pass relationship component 414.

Pass manager component 408 generates an output quantum circuit design 406. Output quantum circuit design 406 represents an optimized quantum circuit design from the input quantum circuit design 404. Input quantum circuit design 404 may undergo a series of analysis passes and transformation passes to generate the output quantum circuit design 406. In some embodiments, the output quantum circuit design 406 includes changed properties from the input quantum circuit design 404. For example, the output quantum circuit design 406 may include a different total number of quantum logic gates, different types of quantum logic gates, different depth, and other quantum circuit properties which differ from the input quantum circuit design 404.

Figure 5:
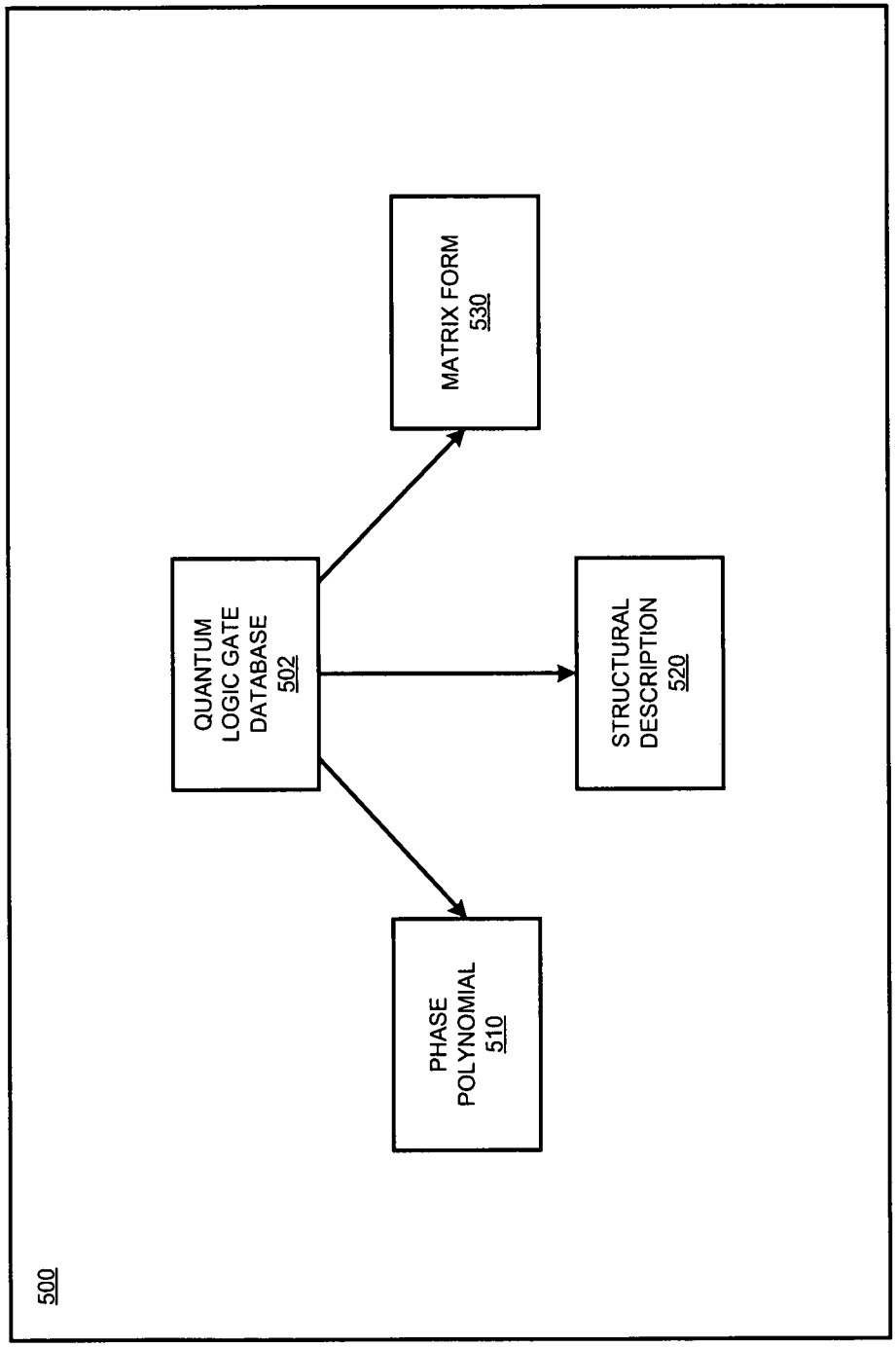
FIG. 5 depicts a block diagram showing a number of quantum logic gate representations stored within a quantum logic gate database.

With reference to FIG. 5, this figure depicts a block diagram showing a number of quantum logic gate representations stored within a quantum logic gate database. The quantum logic gate database 502 includes at least one structural or mathematical representation of quantum circuit elements, such as a quantum logic gate. For example, the quantum logic gate database 502 includes a phase polynomial representation 510, a structural description representation 520, and a matrix form representation 530.

A phase polynomial quantum logic gate representation 510 is a mathematical description of quantum circuit elements in polynomial form. The phase polynomial representation 520 may be used for certain sections of the quantum circuit design. The structural description representation 520 stores a quantum circuit as a list of gates to be applied sequentially, also known as a netlist. The matrix form representation 530 stores quantum logic gates as matrix operators, such as the matrix operator corresponding to quantum logic gate 302 shown in FIG. 3. The quantum logic gate database 502 may be stored within storage 108. Application 402 uses quantum circuit design database 502 during at least one of the optimization methods described herein. For example, pass manager 408 launches a transformation pass. The launched transformation pass may require the quantum circuit design to be in phase polynomial representation. The pass manager 408 may then launch an analysis pass to collect information and update the phase polynomial representation of the quantum circuit design.

Figure 6:
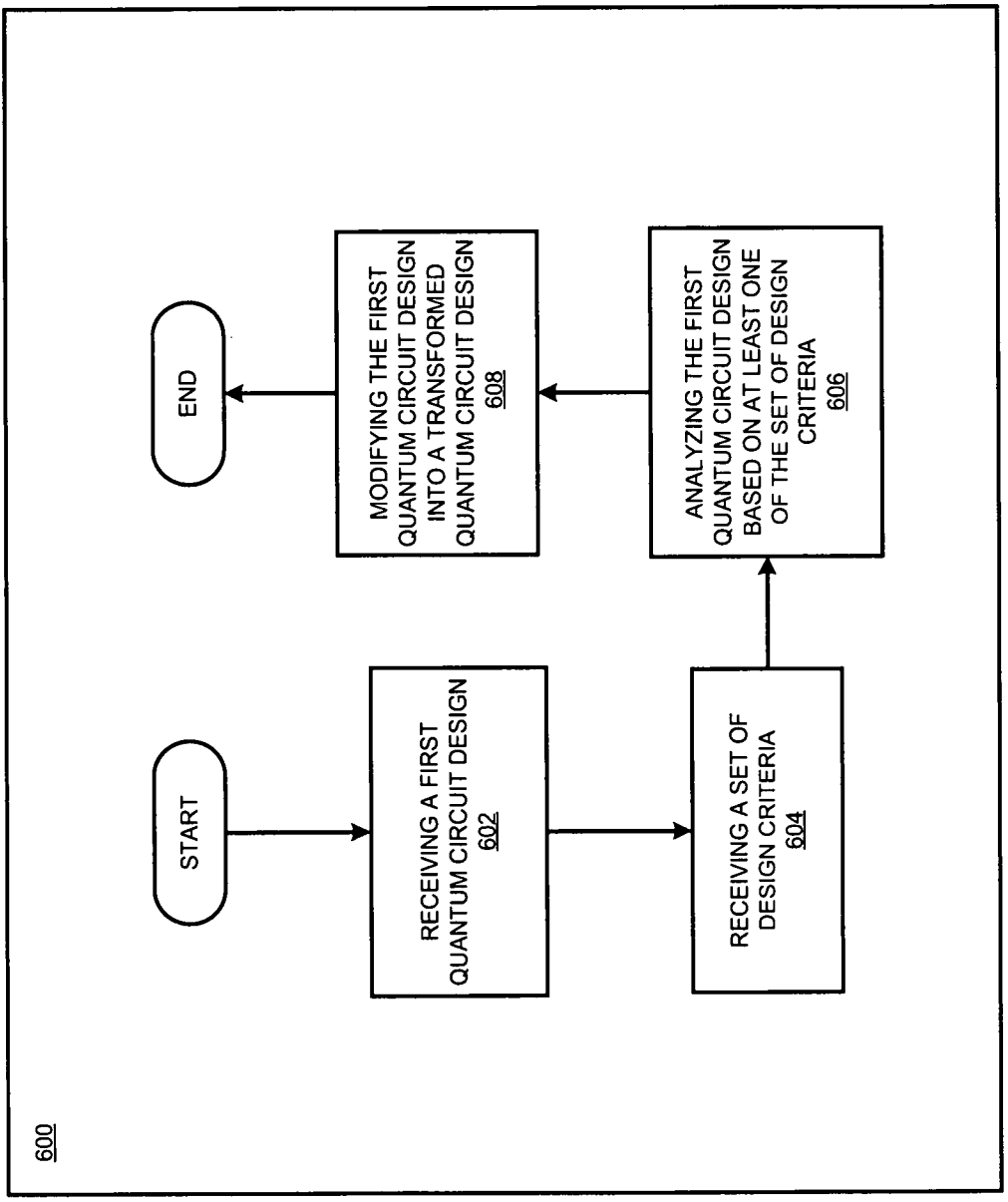
FIG. 6 depicts a flowchart of an example method for design optimization of quantum circuits in accordance with an illustrative embodiment.

With reference to FIG. 6, this figure depicts a flowchart of an example method 600 for design optimization of quantum circuits in accordance with an illustrative embodiment. In block 602, application 402 receives a first quantum circuit design. In an embodiment, the first quantum circuit design includes a set of quantum logic gates.

In block 604, application 402 receives a set of design criteria for a new quantum circuit design. A design criterion in the set of design criteria in an embodiment includes changing a size of a matrix of transformations corresponding to a number of qubits employed in the quantum circuit design. In some embodiments, the design criteria includes at least one of an overall precision for the quantum circuit, a predefined number of total logic gates, a predefined maximum depth of the circuit, a predefined number of individual type of logic gates, optimizing the quantum circuit for use with a specific device, or any other relevant design criteria for the quantum circuit. In another embodiment, application 402 previously includes a first quantum circuit design and a set of design criteria for a new quantum circuit design. For example, application 402 includes stored quantum circuit designs, each quantum circuit design including a set of quantum logic gates. In an embodiment, application 402 includes stored sets of design criteria for the stored quantum circuit designs. A design criterion in each stored set of design criteria in an embodiment includes changing a size of a matrix of transformations corresponding to a number of qubits employed in the stored quantum circuit design. In an embodiment, application 402 begins at block 606 if application 402 previously includes stored quantum circuit designs and stored set of design criteria for a new quantum circuit design.

In block 606, application 402 analyzes the first quantum circuit design based on at least one of the set of design criteria. For example, the application 402 launches an analysis pass to collect information about the first quantum circuit design. In some embodiments, the analysis pass returns a total number of gates, a depth of the quantum circuit design, a number of individual type of quantum logic gates, entanglement state of qubits, or any other relevant property of the quantum circuit design. The depth of the quantum circuit design is the maximal length of a path from an input gate of the quantum circuit design to the output gate of the quantum circuit design. In block 608, application 402 modifies the first quantum circuit design into a transformed quantum circuit design. For example, the application 402 launches a transformation pass to modify the first quantum circuit design. In an embodiment, modifying the first quantum circuit design causes the transformed quantum circuit design to perform an operation implemented in the first quantum circuit design with a changed matrix of transformations. Method 600 then ends.

Figure 7:
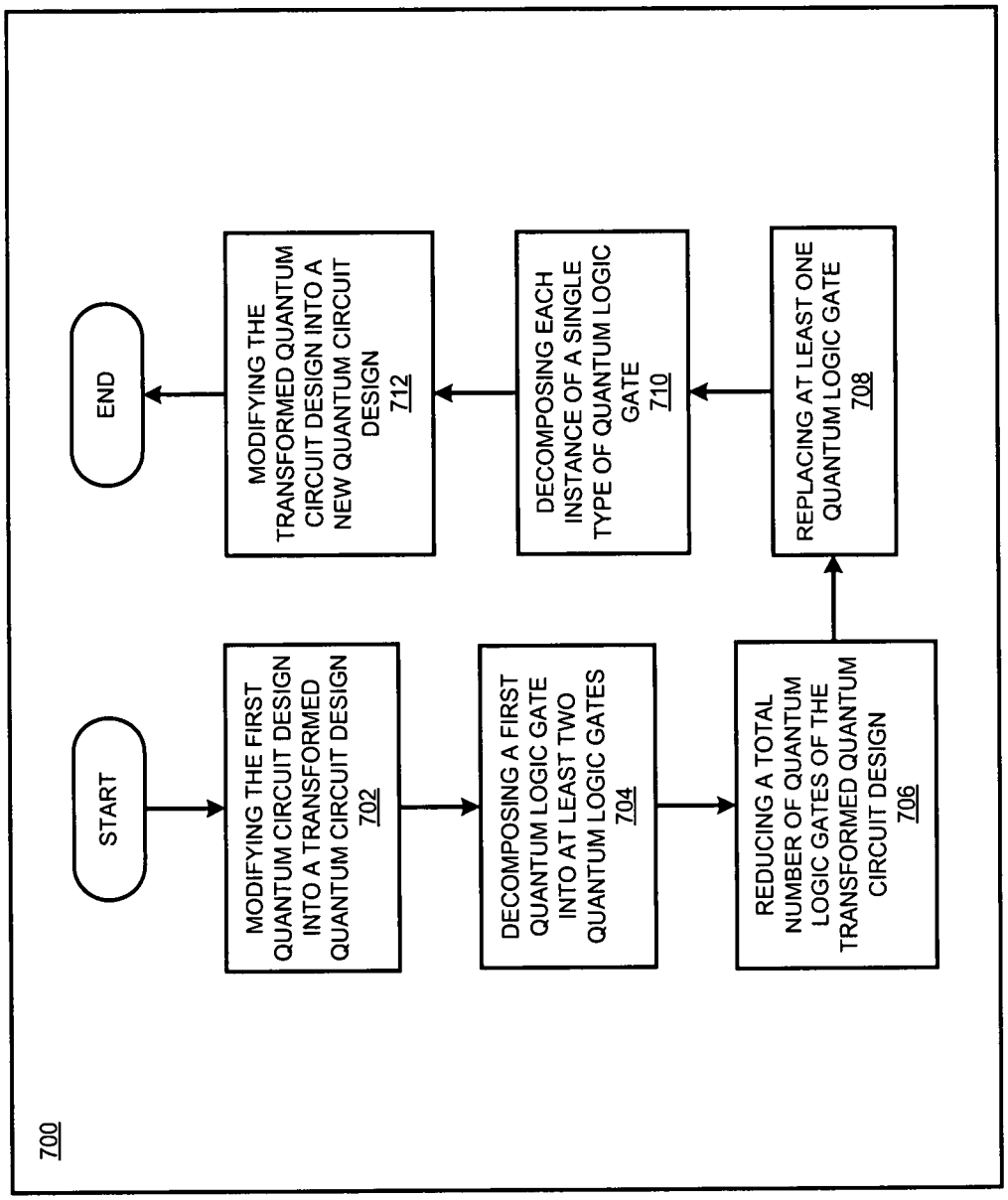
FIG. 7 depicts a flowchart of an example method for design optimization of quantum circuits in accordance with an illustrative embodiment.

With reference to FIG. 7, this figure depicts a flowchart of an example method 700 for design optimization of quantum circuits in accordance with an illustrative embodiment. Each block of example method 700 is an optional block to be performed by application 402. Example method 700 may continue from block 606 of method 600. In block 702, application 402 modifies the first quantum circuit design into a transformed quantum circuit design. For example, application 402 launches a transformation pass to modify the first quantum circuit design. In an embodiment, modifying the first quantum circuit design causes the transformed quantum circuit design to perform an operation implemented in the first quantum circuit design with a changed matrix of transformations.

In block 704, application 402 decomposes a first quantum logic gate into at least two quantum logic gates. For example, the application 402 launches a transformation pass to decompose the first quantum logic gate into at least two quantum logic gates. In an embodiment, decomposing the first quantum logic gate causes the transformed quantum circuit design to perform an operation implemented in the first quantum circuit design with a changed matrix of transformations. In block 706, application 402 reduces a total number of quantum logic gates of the transformed quantum circuit design. For example, application 402 launches a transformation pass to delete redundant gates in the transformed quantum circuit design. In an embodiment, reducing a total number of quantum logic gates of the transformed quantum circuit design causes the transformed quantum circuit design to perform an operation implemented in the first quantum circuit design with a changed matrix of transformations.

In block 708, application 402 replaces at least one quantum logic gate. For example, application 402 launches a transformation pass to replace at least one quantum logic gate of the transformed quantum circuit design. In an embodiment, replacing at least one quantum logic gate of the transformed quantum circuit design causes the transformed quantum circuit design to perform an operation implemented in the first quantum circuit design with a changed matrix of transformations. In block 710, application 402 decomposes each instance of a single type of quantum logic gate of the transformed quantum circuit design. For example, application 402 launches a transformation pass to detect and decompose each instance of a single type of quantum logic gate of the transformed quantum circuit design. In an embodiment, decomposing each instance of a single type of quantum logic gate of the transformed quantum circuit design causes the transformed quantum circuit design to perform an operation implemented in the first quantum circuit design with a changed matrix of transformations. Method 700 then ends.

Figure 8:
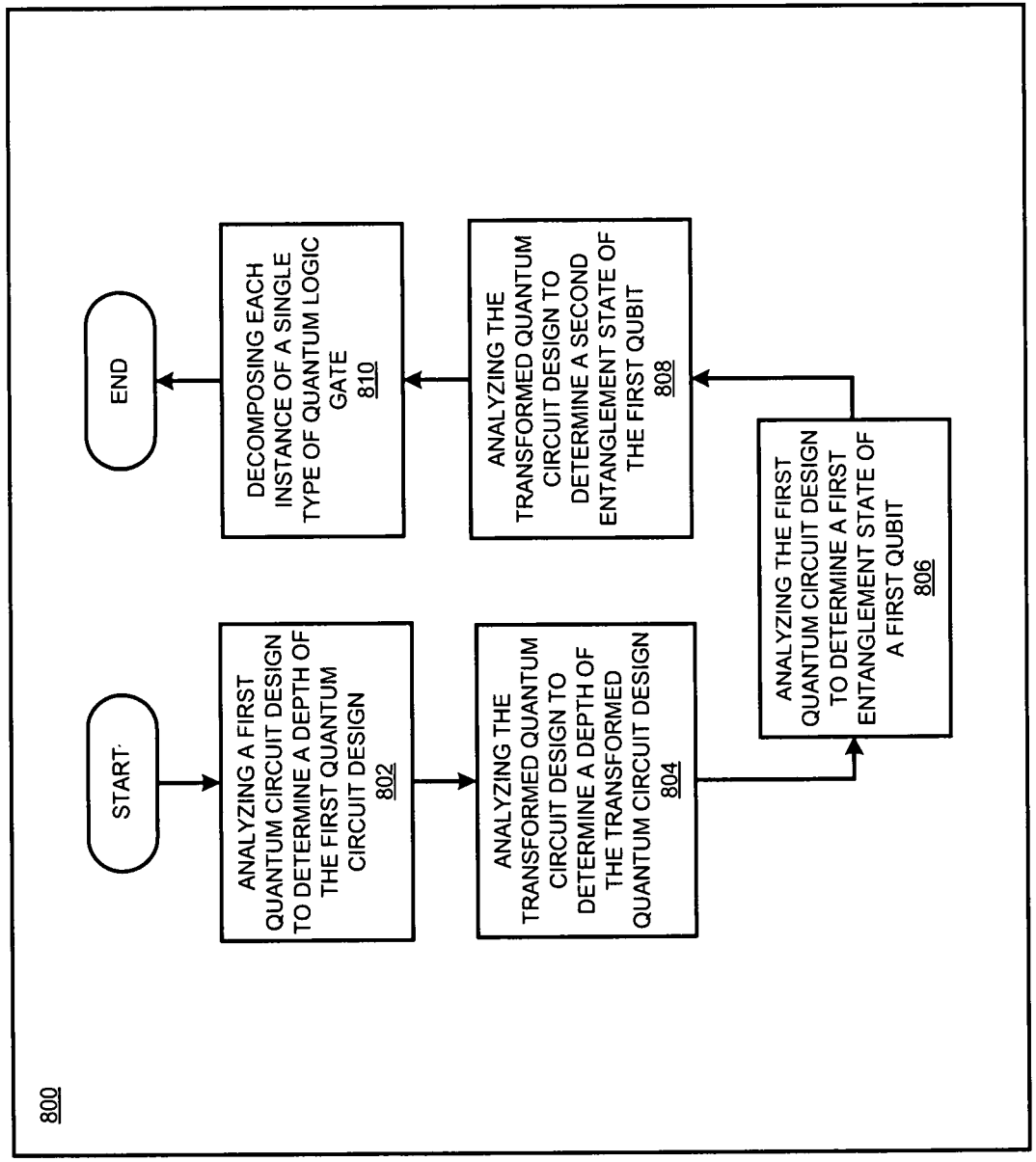
FIG. 8 depicts a flowchart of an example method for design optimization of quantum circuits in accordance with an illustrative embodiment.

With reference to FIG. 8, this figure depicts a flowchart of an example method 800 for design optimization of quantum circuits in accordance with an illustrative embodiment. Each block of example method 800 is an optional block to be performed by application 402. In block 802, application 402 analyzes a first quantum circuit design to determine a depth of the first quantum circuit design. For example, application 402 launches an analysis pass to determine a depth of the first quantum circuit design.

Block 804 may occur after a transformation pass, such as block 608 or 702. In block 804, application 402 analyzes the transformed quantum circuit design to determine a depth of the transformed quantum circuit design. For example, the application 402 launches an analysis pass to determine a depth of the transformed quantum circuit design.

In block 806, application 402 analyzes the first quantum circuit design to determine a first entanglement state of a first qubit. For example, the application 402 launches an analysis pass to determine a first entanglement state of a first qubit. Block 808 may occur after a transformation pass, such as block 608 or 702. In block 808, application 402 analyzes the transformed quantum circuit design to determine a second entanglement state of the first qubit. For example, the application 402 launches an analysis pass to determine a second entanglement state of the first qubit. In some embodiments, the second entanglement state of the first qubit differs from the first entanglement state of the first qubit.

Block 810 may occur before or after a transformation pass, such as block 608 or 702. In block 810, application 402 decomposes each instance of a single type of quantum logic gate. For example, the application 402 launches a transformation pass to detect and decompose each instance of a single type of quantum logic gate. In an embodiment, decomposing each instance of a single type of quantum logic gate causes the transformed quantum circuit design to perform an operation implemented in the first quantum circuit design with a changed matrix of transformations. Method 800 then ends.

Figure 9:
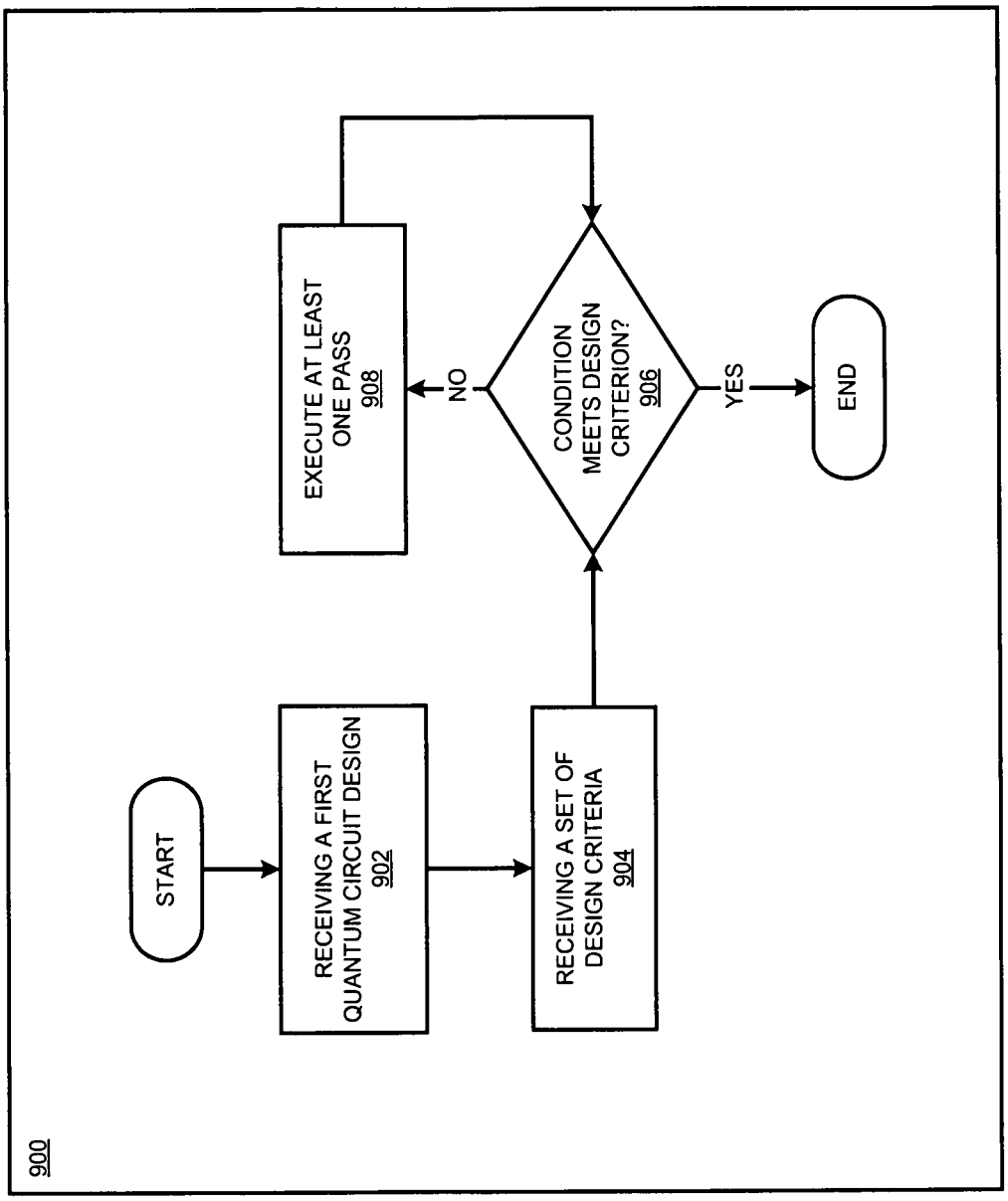
FIG. 9 depicts a flowchart of an example method for design optimization of quantum circuits in accordance with an illustrative embodiment.

With reference to FIG. 9, this figure depicts a flowchart of an example method 900 for design optimization of quantum circuits in accordance with an illustrative embodiment. In block 902, application 402 receives a first quantum circuit design. In an embodiment, the first quantum circuit design includes a set of quantum logic gates.

In block 904, application 402 receives a set of design criteria for a new quantum circuit design. A design criterion in the set of design criteria in an embodiment includes changing a size of a matrix of transformations corresponding to a number of qubits employed in the quantum circuit design. In some embodiments, the design criteria includes at least one of an overall precision for the quantum circuit, a predefined number of total logic gates, a predefined maximum depth of the circuit, a predefined number of individual type of logic gates, optimizing the quantum circuit for use with a specific device, or any other relevant design criteria for the quantum circuit.

In another embodiment, application 402 previously includes a first quantum circuit design and a set of design criteria for a new quantum circuit design. For example, application 402 includes stored quantum circuit designs, each quantum circuit design including a set of quantum logic gates. In an embodiment, application 402 includes stored sets of design criteria for the stored quantum circuit designs. In an embodiment, application 402 begins at block 906 if application 402 previously includes stored quantum circuit designs and stored set of design criteria for a new quantum circuit design.

In block 906, application 402 determines whether a condition of the first quantum circuit design meets a design criterion. For example, pass manager 408 executes an analysis pass on the first quantum circuit design to determine a condition of the first quantum circuit design.

If the condition of the first quantum circuit design does not meet the design criterion ("No" path of block 906), the application 402 moves to block 908. In block 908, application 402 executes at least one pass on the first quantum circuit design to modify the first quantum circuit design into a transformed quantum circuit design. For example, pass manager 408 executes an analysis pass, a transformation pass, or a combination of analysis passes and/or transformation passes on the first quantum circuit design.

Application 402 then returns to block 906. If a condition of the transformed quantum circuit design does not meet the design criterion ("No" path of block 906), the application 402 moves to block 908. In this manner, application 402 implements an iterative process to transform the first quantum circuit design to meet a design criterion of the new quantum circuit design. If a condition of the first quantum circuit design or a condition of the transformed quantum circuit design meets the design criterion ("Yes" path of block 906), method 900 then ends.

In an alternative embodiment, method 900 returns to block 906 to determine whether a second condition of the transformed quantum circuit design meets a second design criterion. Method 900 then continues in a similar manner as described herein according to the determination made in block 906. In this manner, method 900 modifies the transformed circuit design to meet additional design criterion.

Figure 10:
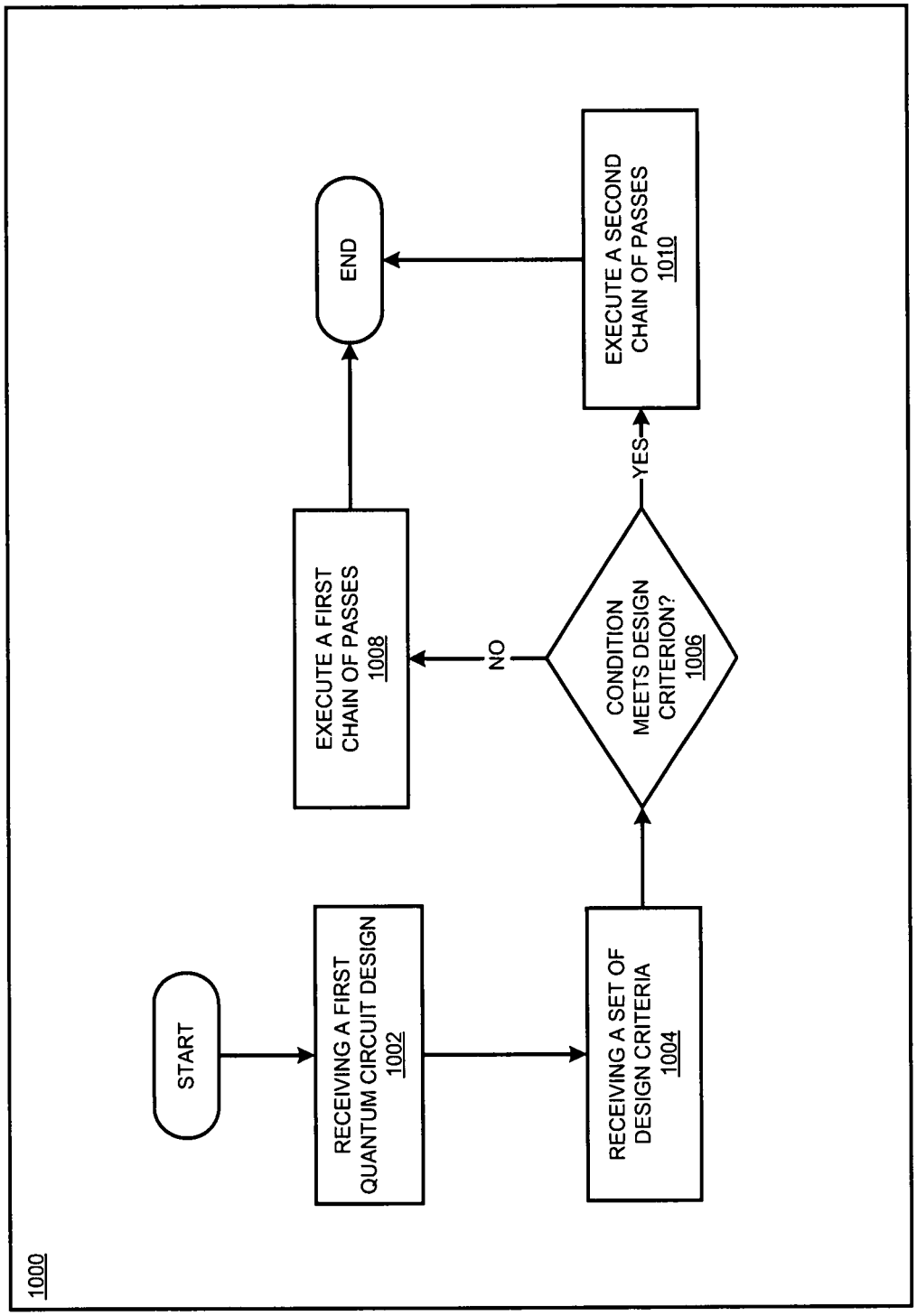
FIG. 10 depicts a flowchart of an example method for design optimization of quantum circuits in accordance with an illustrative embodiment.

With reference to FIG. 10, this figure depicts a flowchart of an example method 1000 for design optimization of quantum circuits in accordance with an illustrative embodiment. In block 1002, application 402 receives a first quantum circuit design. In an embodiment, the first quantum circuit design includes a set of quantum logic gates.

In block 1004, application 402 receives a set of design criteria for a new quantum circuit design. A design criterion in the set of design criteria in an embodiment includes changing a size of a matrix of transformations corresponding to a number of qubits employed in the quantum circuit design. In some embodiments, the design criteria includes at least one of an overall precision for the quantum circuit, a predefined number of total logic gates, a predefined maximum depth of the circuit, a predefined number of individual type of logic gates, optimizing the quantum circuit for use with a specific device, or any other relevant design criteria for the quantum circuit.

In another embodiment, application 402 previously includes a first quantum circuit design and a set of design criteria for a new quantum circuit design. For example, application 402 includes stored quantum circuit designs, each quantum circuit design including a set of quantum logic gates. In an embodiment, application 402 includes stored sets of design criteria for the stored quantum circuit designs. In an embodiment, application 402 begins at block 1006 if application 402 previously includes stored quantum circuit designs and stored set of design criteria for a new quantum circuit design.

In block 1006, application 402 determines whether a condition of the first quantum circuit design meets a design criterion. For example, pass manager 408 executes an analysis pass on the first quantum circuit design to determine a condition of the first quantum circuit design.

If the condition of the first quantum circuit design does not meet the design criterion ("No" path of block 1006), the application 402 moves to block 1008. In block 1008, application 402 executes a first chain of passes on the first quantum circuit design to modify the first quantum circuit design into a transformed quantum circuit design. For example, pass manager 408 executes an analysis pass, a transformation pass, or a combination of analysis passes and/or transformation passes on the first quantum circuit design. Method 1000 then ends.

If the condition of the first quantum circuit design meets the design criterion ("Yes" path of block 1006), the application 402 moves to block 1010. In block 1010, application 402 executes a second chain of passes on the first quantum circuit design to modify the first quantum circuit design into a transformed quantum circuit design. For example, pass manager 408 executes an analysis pass, a transformation pass, or a combination of analysis passes and/or transformation passes on the first quantum circuit design. In an embodiment, the second chain of passes differs from the first chain of passes. For example, the second chain of passes includes a greater or lesser set of passes executed by the pass manager 408 than the first chain of passes. In another embodiment, the second chain of passes includes different types of analysis passes and/or transformation passes executed by the pass manager 408. In another example, the second chain of passes includes a greater or lesser set of pass relationships than the first chain of passes. In another example, the second chain of passes includes different types of pass relationships than the first chain of passes. Method 1000 then ends.

In an alternative embodiment, method 1000 returns to block 1006, after either block 1008 or block 1010, to determine whether a second condition of the transformed quantum circuit design meets a second design criterion. Method 1000 then continues in a similar manner as described herein according to the determination made in block 1006. In this manner, method 1000 modifies the transformed circuit design in accordance with additional design criterion.

Various embodiments of the present invention are described herein with reference to the related drawings. Alternative embodiments can be devised without departing from the scope of this invention. For example, additional analysis and transformation passes may be included in any of methods 600, 700, 800, 900, 1000 without departing from the scope of the present invention.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for design optimization of a quantum circuit, comprising:

analyzing a first quantum circuit design based on at least one of a set of design criteria, wherein the first quantum circuit design comprises a set of quantum logic gates, and wherein a design criterion in the set of design criteria comprises changing a size of a matrix of transformations corresponding to a number of qubits employed in the first quantum circuit design, wherein analyzing the first quantum circuit design further comprises determining a first entanglement state of a first qubit; and modifying the first quantum circuit design into a transformed quantum circuit design, the modifying causing the transformed quantum circuit design to perform an operation implemented in the first quantum circuit design with a changed matrix of transformations.

2. The method of claim 1, further comprising decomposing a first quantum logic gate of the transformed quantum circuit design into at least two quantum logic gates.

3. The method of claim 1, further comprising reducing a total number of quantum logic gates of the first quantum circuit design.

4. The method of claim 1, further comprising replacing at least one quantum logic gate.

5. The method of claim 1, wherein analyzing the first quantum circuit design further comprises determining a depth of the first quantum circuit design.

6. The method of claim 1, further comprising analyzing the transformed quantum circuit design to determine a depth of the transformed quantum circuit design.

7. The method of claim 1, further comprising analyzing the transformed quantum circuit design to determine a second entanglement state of the first qubit.

8. The method of claim 1, further comprising:
decomposing each instance of a single type of quantum logic gate.

9. The method of claim 1, wherein a total number of logic gates of the transformed quantum circuit design is less than a total number of logic gates of the first quantum circuit design.

10. A computer usable program product comprising a computer-readable storage device, and program instructions stored on the storage device, the stored program instructions comprising:
program instructions to analyze a first quantum circuit design based on at least one of a set of design criteria, wherein the first quantum circuit design comprises a set of quantum logic gates, and wherein a design criterion in the set of design criteria comprises changing a size of a matrix of transformations corresponding to a number of qubits employed in the first quantum circuit design, wherein analyzing the first quantum circuit design further comprises determining a first entanglement state of a first qubit; and
program instructions to modify the first quantum circuit design into a transformed quantum circuit design, the modifying causing the transformed quantum circuit design to perform an operation implemented in the first quantum circuit design with a changed matrix of transformations.

11. The computer usable program product of claim 10, wherein the computer usable code is stored in a computer readable storage device in a data processing system, and wherein the computer usable code is transferred over a network from a remote data processing system.

12. The computer usable program product of claim 10, wherein the computer usable code is stored in a computer readable storage device in a server data processing system, and wherein the computer usable code is downloaded over a network to a remote data processing system for use in a computer readable storage device associated with the remote data processing system.

13. The computer usable program product of claim 10, the stored program instructions further comprising:
program instructions to decompose a first quantum logic gate of the transformed quantum circuit design into at least two quantum logic gates.

14. The computer usable program product of claim 10, the stored program instructions further comprising:
program instructions to reduce a total number of quantum logic gates of the first quantum circuit design.

15. The computer usable program product of claim 10, the stored program instructions further comprising:
program instructions to replace at least one quantum logic gate.

16. The computer usable program product of claim 10, wherein program instructions to analyze the first quantum circuit design further comprises:
program instructions to determine a depth of the first quantum circuit design.

17. The computer usable program product of claim 10, the stored program instructions further comprising:
program instructions to analyze the transformed quantum circuit design to determine a depth of the transformed quantum circuit design.

18. The computer usable program product of claim 10, the stored program instructions further comprising:
program instructions to decompose each instance of a single type of quantum logic gate.

19. A computer system comprising a processor, a computer-readable memory, and a computer-readable storage device, and program instructions stored on the storage device for execution by the processor via the memory, the stored program instructions comprising:
program instructions to analyze a first quantum circuit design based on at least one of a set of design criteria, wherein the first quantum circuit design comprises a set of quantum logic gates, and wherein a design criterion in the set of design criteria comprises changing a size of a matrix of transformations corresponding to a number of qubits employed in the quantum circuit design, wherein analyzing the first quantum circuit design further comprises determining a first entanglement state of a first qubit; and
program instructions to modify the first quantum circuit design into a transformed quantum circuit design, the modifying causing the transformed quantum circuit design to perform an operation implemented in the first quantum circuit design with a changed matrix of transformations.

* * * * *